United States Patent [19]

Leuschner et al.

[11] Patent Number: 5,512,334
[45] Date of Patent: Apr. 30, 1996

[54] METHOD FOR THE PRODUCTION OF A BOTTOM RESIST

[75] Inventors: Rainer Leuschner, Erlangen; Recai Sezi, Roettenbach; Michael Sebald, Hessdorf-Hannberg, all of Germany

[73] Assignee: Siemens Aktiengesellschaft, München, Germany

[21] Appl. No.: 301,285

[22] Filed: Sep. 6, 1994

Related U.S. Application Data

[62] Division of Ser. No. 945,766, Sep. 16, 1992, Pat. No. 5,368,901.

[30] Foreign Application Priority Data

Sep. 27, 1991 [DE] Germany ............ 41 32 313.0

[51] Int. Cl.$^6$ ........................... B05D 3/06
[52] U.S. Cl. .............. 427/558; 427/282; 427/333; 427/379; 427/385.5; 427/407.1; 427/559; 427/569; 427/574
[58] Field of Search ................ 427/248, 379, 427/282, 385.5, 333, 558, 559, 569, 574, 407.1

[56] References Cited

U.S. PATENT DOCUMENTS

| | | | |
|---|---|---|---|
| 3,922,403 | 11/1975 | Sample, Jr. et al. | 427/340 |
| 5,141,970 | 8/1992 | McArdle et al. | 522/170 |

FOREIGN PATENT DOCUMENTS 0395917  11/1990  European Pat. Off. .

OTHER PUBLICATIONS

Sebald, M. et al. "Chemical Amplification of Resist Lines", *Microelectronic Eng.*, vol. 11 (1990), pp. 531–534. (No Mo.).
Ruska, W. Scot, *Microelectronic Processing*, (McGraw Hill 1987), pp. 227–230. (No Mo.).
Sebald, M. et al., "Chemical Amplification of Resist Lines", *Proc. SPIE*, vol. 1262 (1990), pp. 528–537. (No Mo.).
Tweed, B. et al., "Magnetron Ion Etching of Polyimide and AZ Resist for VLSI", *J. Electrochem, Soc.*, vol. 135, No. 11 (1988), pp. 2896–2899. (No Mo.).
Shaw, J. et al., "Polysiloxanes for Optical Lithography", *Solid State Technology*, Jun. 1987, pp. 83–89.
Stillwagon, L. E. et al., "Evaluation of Several Organic Materials As Planarizing Layers for Lithographic and Etchback Processing", *Polymer Mater. Science Eng.*, vol. 60 (1989), pp. 385–389. (No Mo.).
Miura, S. et al., "Comparison of Silicon Containing Resist and Silylation of Imaged Resist for Multilayer Resist Lithography on a Metal Lif–Off Application", *J. Electrochem. Soc.*, vol. 138, No. 6 (1991), pp. 1765–1769. (No Mo.).
Reck, B. et al., "Novel Photoresist Design Based on Electrophilic Aromatic Substitution", *Proc. SPE*, Ellenville, N.Y. (1988), pp. 63–72, see p. 66, line 32 & 33 of the description. (No Mo.).
Feely, Wayne E. et al., "The Role of the Latent Image in a New Dual Image, Aqueous Developable, Thermally Stable Photoresist", *Proc. SPE*, Ellenville, NY (1985), pp. 49–64, see p. 5, line 1 of the description. (No Mo.).
IBM Technical Disclosure Bulletin, vol. 31, No. 6 (Nov. 1988), p. 11.
IBM Technical Disclosure Bulletin, vol. 15, No. 7 (Dec. 1972), pp. 2339–2340.

*Primary Examiner*—Janyce Bell
*Attorney, Agent, or Firm*—Kenyon & Kenyon

[57] ABSTRACT

A method for producing a bottom resist for a two-layer $O_2$/Reactive Ion Etching system which fulfills all the requirements set for such a resist. A varnish layer of a base polymer containing an aromatic, a cross-linking agent and an acid-forming agent is applied to a substrate. The varnish layer is flood-exposed to release a strong acid from the acid-forming agent in the surface region of the layer. This is followed by thermal curing.

14 Claims, No Drawings

METHOD FOR THE PRODUCTION OF A BOTTOM RESIST

This application is a division of application Ser. No. 07/945,766 filed Sep. 16, 1992 now U.S. Pat. No. 5,368,901.

BACKGROUND OF THE INVENTION

1. Field of the Invention

The invention relates to a method for the production of a bottom resist for a two-layer $O_2$/Reactive Ion Etching system.

2. Description of Related Art

In the photolithographic production of resist structures with light having a wavelength of approximately 250 nm, two-layer $O_2$/RIE systems (RIE=Reactive Ion Etching) are one of the few possibilities of producing dimensionally accurate structures, even with low definition imaging lenses, when using high wafer topography. In this connection, a top resist which contains silicon, or which can be silylated, is applied to a planarizing and absorbent bottom resist. This top resist is then exposed and developed, as well as silylated, if necessary, or chemically expanded, and subsequently, the structure obtained in this way is transferred into the bottom resist by means of an oxygen plasma (see, for example: "Microelectr. Eng.," Vol. 11 (1990), pages 531 to 534).

The bottom resist must possess the following properties:

high etch resistance against substrate etching heat shape retention above 100° C.

non-solubility in solvents for the top resist, developer solutions and, if necessary, silylation or expansion solutions high absorption at the exposure wavelength good planarization properties easy removability by means of non-hazardous stripping media.

The latter requirement is particularly significant if the two-layer $O_2$/RIE system is to be used for so-called lift-off processes (see in this regard: W. Scot Ruska, "Microelectronic Processing," McGraw-Hill Book Company, 1987, pages 227 to 230).

Generally, standard Novolak resists are used as the bottom resist; these are heated at temperatures above 200° C. and become insoluble in solvents and developer solutions in this manner (see in this regard: "Proc. SPIE," Vol. 1262 (1990), pages 528 to 537). In many cases, polyimide pre-stages tempered at approximately 400° C. are also used as the bottom resist; at this temperature, these are converted into insoluble polyimides see: "J. Electrochem. Soc.," Vol. 135 (1988), pages 2896 to 2899, as well as "Solid State Technology," June 1987, pages 83 to 89). Such resist systems demonstrate a high proportion of aromatics and—because of the heating process—are even more stable against etching than normal photoresists based on Novolak, in which the heating process generally leads to cross-linking. However, these resist systems are so insoluble that they can no longer be removed by conventional stripping media.

Heated Novolaks can only be removed by oxidizing, strong acids, such as Caro acid, i.e. peroxomonosulfuric acid ($H_2SO_5$), or fuming nitric acid. However, not all substrates tolerate such treatment. For example, aluminum, which is used as a material for tracks, is soluble in Caro acid and can easily be converted to aluminum oxide by oxidizing media. Stripping of the bottom resist with such media would therefore result in damage to the tracks. When using fuming nitric acid, the aluminum would be passivated, but this stripping medium is dubious from a toxicological point of view. Polyimides, on the other hand, can be removed by solutions containing hydrazine, such as mixtures of ethylene diamine and hydrazine hydrate, but there are also serious toxicological reservations against such solutions, since the maximum workplace concentration (MAK value) of hydrazine is only 5 ppm.

Frequently, resists are also removed by means of an oxygen plasma causing them to oxidize to CO, $CO_2$ and $H_2O$. However in the case of two-layer systems if residues of the top resist containing silicon are still present after substrate etching, the silicon would be oxidized to $SiO_2$, which would then remain on the wafer in the form of fine particles, and can result in defects.

To achieve good planarization, materials are also already known for bottom resists, which are cured not thermally, but photolyrically (see in this regard: "Polym. Mater. Sci. Eng.," Vol. 60 (1989), pages 385 to 389). This involves aromatic methacrylic and epoxy compounds. However, these materials demonstrate at least 20% lesser etching stability than Novolaks. In order to offset this lack of stability, thicker layers are required. The known systems furthermore require curing only by UV light. Curing can therefore already occur during plasma etching, due to the UV light that occurs in this connection.

It is also known to use an additional lift-off layer of polysulfone in two-layer $O_2$/RIE systems for the lift-off technique, with a Novolak layer being applied over it (see: "J. Electrochem. Soc.," Vol. 138 (1991), pages 1765 to 1769). After heating of the Novolak, the polysulfone still remains soluble (in N-methyl pyrrolidone), so that the layer structured using a resist containing silicon can be removed by means of a lift-off process. Such a procedure requires two additional layers (of different materials). However, the more additional varnishing steps are necessary, the more the defect density increases, as a rule.

SUMMARY OF THE INVENTION

It is the object of the invention to provide a method which allows for the production of a bottom resist for a two-layer $O_2$/RIE system, which fulfills all the requirements set for such a resist, with easy removability being a particular prerequisite.

This is achieved, according to the invention, in that a varnish layer of a base polymer containing an aromatic, a cross-linking agent and an acid-forming agent is applied to a substrate, that the varnish layer—to release a strong acid from the acid-forming agent in the surface region of the layer—is flood-exposed, and that thermal curing takes place.

DETAILED DESCRIPTION OF THE INVENTION

In the method according to the invention, a base polymer containing an aromatic is used, i.e. a polymer which is sufficiently stable against halogen substrate etch processes and thus demonstrates an etch stability which corresponds at least to that of Novolaks. Therefore, a Novolak is preferably used as the base polymer. In addition, polybenzoxaxol pre-stages can also be used.

The base polymer is applied, in solution—together with a cross-linking agent and a latent acid—to a substrate, which is generally a wafer. Application especially takes place by means of spin-coating. Pre-drying takes place after application. Preferably, hexamethylene tetramine or a Novolak pre-stage is used as the cross-linking agent (see in this regard: "Proc. SPE," Ellenville, N.Y. (1988), pages 63 to 72), as well as melamine resin pre-stages (see in this regard: "Proc. SPE," Ellenville, N.Y. (1985), pages 49 to 64). The latent acid, i.e. the acid-forming agent, is preferably a compound which splits off hydrochloric gas upon exposure. Furthermore, so-called Crivello salts are possible for this use, i.e. onium compounds such as sulfonium or iodonium compounds.

The base polymer is thermally cured with the cross-linking agent—with acid catalysis; curing generally takes place at temperatures >100° C. The acid required for this is produced in a photolyric manner, but only in the surface region of the varnish layer. In this way, the result achieved is that the bottom resist is cross-linked only at the surface, and therefore is stable against the solvent for the top resist and against the developer and, if necessary, against a silylation or expansion solution. After the structure is produced in the top resist and it is transferred to the bottom resist by means of oxygen plasma, deeper, non-cross-linked layer regions are also exposed, so that the bottom resist—together with the residues of the top resist remaining on the surface—can be dissolved off with a non-toxic organic solvent. This takes place, for example, by means of N-methyl pyrrolidone, in a type of lift-off process.

During the structure transfer in the oxygen plasma, UV light is emitted, and the substrate is heated to approximately 100° C. This is the case to a particular degree in magnetron etching systems, which are of particular significance as single slice etching systems. This UV light, or the heating, can be sufficient, with generally used bottom resists, to cause cross-linking—which is actually undesirable. If, for example, a commercially available photo-cross-linkable polyimide pre-stage is used, this can be photolyrically cured. If this material is treated with an organic solvent after etching in the oxygen plasma, i.e. stripped, it is true that lines which are located in a close grid are dissolved, since they provide sufficient shade for each other. However, resist lines which stand in isolation remain in place, since here, the resist slopes were cross-linked by the UV light produced in the plasma, and therefore have become insoluble for the stripping medium.

In the method according to the invention, it is true that the acid is photolyrically produced, but a curing reaction only takes place if the substrate is heated to a temperature of >100° C.—simultaneously or subsequently—preferably to a temperature of approximately 140° to 150° C. Since these temperatures are not reached in the plasma, there is no risk, with this method, that isolated lines are not dissolved off and therefore defects occur. In addition, unproblematical solvents, i.e., organic solvents which present less of a health hazard, can be used to completely remove the resist.

In the method according to the invention, it is essential that curing of the bottom resist is limited to the surface region of the varnish layer. In order to ensure this, deep UV light is preferably used to release the acid from the acid-forming agent, i.e. work is carried out in the DUV range (DUV=Deep UV). The base polymer of the bottom resist, which contains aromatics, absorbs in this wavelength range, so that the penetration depth of the light is limited. Furthermore, with the method according to the invention, it is advantageous to use an acid-forming agent which does not bleach when exposed, and therefore can only be photolyzed in the surface layer. The acid-forming agent is also not allowed to form any non-volatile oxides in the oxygen plasma. Therefore, compounds which split off chlorine under UV light and therefore form HCl as the strong acid, or Crivello salts, which form trifluoromethane sulfonic acid, for example, are preferred.

The bottom resist is supposed to suppress reflections from the substrate during the structuring exposure. In deep L/V, for example 248 nm, this requirement is fulfilled, since the base polymer and the acid-forming agent absorb strongly here. If, however, structuring exposure takes place in the near UV, i.e. in the so-called NUV range (NUV=Near LTV), for example at 365 or 436 nm, a light-resistant pigment for this wavelength range has to be added to the bottom resist, i.e. the varnish layer, in order to achieve sufficient absorption.

With the method according to the invention, better planarization can also be achieved than with a purely thermally cured resist. In the combined photolyric/thermal surface curing, the volume shrinkage is less than for purely thermal curing, which impacts the entire volume and takes place at higher temperatures.

The technical expenditure is not much greater with the method according to the invention than with conventional bottom resists with thermal hardening. All that is required is that a strong UV emitter is installed above the heating segment, as known for DUV curing systems, for example. The exposure times then lie in the range of a few seconds, so that the usual cycle times for varnishing can be adhered to.

The following examples are illustrative of the invention but should not be taken in a restrictive sense.

EXAMPLE 1

Bottom resist for 248 nm exposure

From 22.7 PW of a commercially available phenol Novolak (PW=parts by weight), 2.2 PW 2-(trichloromethyl)-( 4(3H)-quinazolinone (as the acid-forming agent), 3.1 PW hexamethylene tetramine (as the cross-linking agent), 30 PW benzyl alcohol and 42 PW cyclohexanone, a varnish solution is produced. This solution is centrifuged onto a 3 inch silicon wafer, so that a final layer thickness of 1.8 µm is obtained. After pre-drying (90° C., 60 s) on a hot plate, and flood exposure (DUV, 3000 mJ/cm$^2$) with subsequent heating to approximately 150° C. (60 s), a layer of the bottom resist with a cross-linked surface is obtained. This surface is no longer dissolved or swollen by the following media: methoxypropyl acetate (solvent for the top resist), NM-DW 2.38% (commercial alkaline developer), solution of an oligomeric diaminomethyl siloxane in a 4:1 mixture of isopropanol and water (expansion, i.e. silylation agent) and isopropanol (rinsing fluid).

After varnishing of the bottom resist with a top resist containing silicon (see in this regard, for example, EP-OS 0 395 917), structurizing exposure of the top resist at 248 nm using a mask, in such a manner that during development, resist lines of 2 to 0.5 µm occur, as well as expansion and/or silylation treatment (see in this regard: "Proc. SPIE.," Vol. 1262 (1990), pages 528 to 537) and structure transfer in the oxygen plasma, the silicon substrate is etched to a depth of 100 nm in CF$_4$ plasma. It is shown that the etch stability of the bottom resist is as great as that of commercial single-layer photoresists based on Novolak. Subsequently, the bottom resist, together with the top resist located on it, is stripped with N-methyl pyrrolidone in a spray developer (2 bar tank pressure 1000 revolutions per minute). Raster electron microscope examinations show that residues of the bottom resist are no longer present.

EXAMPLE 2

Bottom resist for 436 nm exposure

From 20 PW of a commercially available phenol Novolak (PW=parts by weight), 2 PW triphenylsulfonium trifluoromethane sulfonate (as the acid-forming agent), 6 PW bis(hydroxymethyl)-p-cresol as the cross-linking agent), 3 PW of a commercially available yellow pigment and 67 PW cyclohexanone, a varnish solution ms produced. This solution is centrifuged onto a 3 inch silicon wafer, so that a final layer thickness of 1.8 μm is obtained. After pre-drying (90° C. 60 s) on a hot plate, and flood exposure (DUV, 3000 mJ/cm$^2$) with subsequent heating to approximately 140° C. (60 s), a layer of the bottom resist with a cross-linked surface is obtained. This surface is no longer dissolved or swollen by the following media: methoxypropyl acetate (solvent for the top resist), NMD-W 2.38% (commercial alkaline developer), solution of an oligomeric aminomethyl siloxane in a 4:1 mixture of isopropanol and water (expansion, i.e. silylation agent) and isopropanol (rinsing fluid).

After varnishing of the bottom resist with a top resist containing silicon (see in this regard, for example, EP-OS 0 395 917), structurizing exposure of the top resist at 436 nm using a mask, in such a manner that during development, resist lines of 2 to 0.5 μm occur, as well as expansion and/or silyation treatment (see in this regard: "Proc. SPIE.," Vol. 1262 (1990), pages 528 to 537) and structure transfer in the oxygen plasma, the silicon substrate is etched to a depth of 100 nm in CF$_4$ plasma. It is shown that the etch stability of the bottom resist is as great as that of commercial single-layer photoresists based on Novolak. Subsequently, the bottom resist, together with the top resist located on it, is stripped with N-methyl pyrrolidone in a spray developer (2 bar tank pressure, 1000 revolutions per minute). Raster electron microscope examinations show that no residues of the bottom resist are no longer present.

What is claimed is:

1. A method for the production of a resist structure by means of a two-layer O$_2$/Reactive Ion Etching system, comprising the steps of: applying a varnish layer of a base polymer containing an aromatic group, a cross-linking agent and a strong acid-forming agent to a substrate; flood-exposing the varnish layer with deep UV light so as to release a strong acid from the strong acid-forming agent in a surface region of the layer; thermally curing the layer at a temperature of greater than 100° C. to obtain a bottom resist; applying a silicon-containing or silylizable top resist to the bottom resist; exposing the top resist with deep UV light or near UV light using a mask and developing the top resist to obtain a pattern; and transferring the pattern from the top resist into the bottom resist by using a reactive ion etching oxygen plasma.

2. The method according to claim 1 wherein the strong acid-forming agent generates hydrochloric gas upon exposure.

3. The method according to claim 2 wherein a novolak is used as the base polymer.

4. The method according to claim 3 wherein hexamethylene tetramine is used as the cross-linking agent.

5. The method according to claim 2 wherein hexamethylene tetramine is used as the cross-linking agent.

6. The method according to claim 2 wherein a novolak pre-stage is used as the cross-linking agent.

7. The method according to claim 1 wherein a Crivello salt is used as the acid-forming agent.

8. The method according to claim 7 wherein a novolak is used as the base polymer.

9. The method according to claim 7 wherein hexamethylene tetramine is used as the cross-linking agent.

10. The method according to claim 1 wherein a novolak is used as the base polymer.

11. The method according to claim 10 wherein hexamethylene tetramine is used as the cross-linking agent.

12. The method according to claim 1 wherein hexamethylene tetramine is used as the cross-linking agent.

13. The method according to claim 1 wherein a novolak pre-stage is used as the cross-linking agent.

14. The method according to claim 1 further comprising the step of silylating the exposed and developed top resist.

* * * * *